(12) United States Patent
Hirota et al.

(10) Patent No.: US 11,855,035 B2
(45) Date of Patent: *Dec. 26, 2023

(54) STACK OF ELECTRICAL COMPONENTS AND METHOD OF PRODUCING THE SAME

(71) Applicant: TDK Corporation, Tokyo (JP)

(72) Inventors: Yohei Hirota, Tokyo (JP); Hiroshi Yamazaki, Tokyo (JP); Hitoshi Iwama, Tokyo (JP); Yusuke Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 263 days.

This patent is subject to a terminal disclaimer.

(21) Appl. No.: 17/362,094

(22) Filed: Jun. 29, 2021

(65) Prior Publication Data

US 2021/0327846 A1 Oct. 21, 2021

Related U.S. Application Data

(63) Continuation of application No. 16/556,809, filed on Aug. 30, 2019, now Pat. No. 11,088,106.

(30) Foreign Application Priority Data

Oct. 12, 2018 (JP) ................................. 2018-193174

(51) Int. Cl.
*H01L 23/00* (2006.01)
*H01L 25/18* (2023.01)

(52) U.S. Cl.
CPC .............. *H01L 24/73* (2013.01); *H01L 24/29* (2013.01); *H01L 24/32* (2013.01); *H01L 24/40* (2013.01);

(Continued)

(58) Field of Classification Search
CPC .............................. H01L 24/73; H01L 24/29; H01L 2224/40106
See application file for complete search history.

(56) References Cited

U.S. PATENT DOCUMENTS

| | | |
|---|---|---|
| 6,101,098 A | 8/2000 | Noda |
| 6,756,252 B2 | 6/2004 | Nakanishi |

(Continued)

FOREIGN PATENT DOCUMENTS

| | | |
|---|---|---|
| JP | 09051020 A | 2/1997 |
| JP | H11-233531 A | 8/1999 |

(Continued)

OTHER PUBLICATIONS

Notice of Reasons for Refusal dated Oct. 13, 2020 in corresponding JP application No. 2018-193174 ( and English translation).

*Primary Examiner* — Dale E Page
*Assistant Examiner* — Wilner Jean Baptiste
(74) *Attorney, Agent, or Firm* — POSZ LAW GROUP, PLC

(57) ABSTRACT

A stack of electrical components has a first electrical component having a first surface, a second surface that is opposite to the first surface and a side surface that is located between the first surface and the second surface; a second electrical component having a third surface on which the first electrical component is mounted, the third surface facing the second surface and forming a corner portion between the third surface and the side surface; an adhesive layer that bonds the first electrical component to the second electrical component, the adhesive layer has a first portion that is located between the second and third surface and a second portion that is made of a same material as the first portion and that fills the corner portion; and a conductive layer that extends on a side of the side surface, curves along the second portion and extends to the third surface.

19 Claims, 13 Drawing Sheets

(52) U.S. Cl.
CPC .............. *H01L 24/83* (2013.01); *H01L 24/92* (2013.01); *H01L 25/18* (2013.01); *H01L 2224/26145* (2013.01); *H01L 2224/29191* (2013.01); *H01L 2224/32145* (2013.01); *H01L 2224/40106* (2013.01); *H01L 2224/40145* (2013.01); *H01L 2224/73263* (2013.01); *H01L 2224/83855* (2013.01); *H01L 2224/92246* (2013.01)

(56) References Cited

U.S. PATENT DOCUMENTS

| | | |
|---|---|---|
| 9,466,580 B2 | 10/2016 | Paek et al. |
| 11,088,106 B2 * | 8/2021 | Hirota ................. H01L 24/73 |
| 2004/0227235 A1 | 11/2004 | Hashimoto |
| 2006/0192299 A1 | 8/2006 | Hashimoto |
| 2007/0155050 A1 | 7/2007 | Hashimoto |
| 2008/0096315 A1 | 4/2008 | Jeong et al. |
| 2008/0230922 A1 * | 9/2008 | Mochizuki .......... H01L 23/5389 257/E21.507 |
| 2012/0119385 A1 * | 5/2012 | Co ........................ H01L 24/24 257/E23.141 |
| 2017/0225945 A1 | 8/2017 | Cok |
| 2017/0328962 A1 | 11/2017 | Schott et al. |
| 2018/0100902 A1 | 4/2018 | Schott et al. |

FOREIGN PATENT DOCUMENTS

| | | |
|---|---|---|
| JP | 2004-039988 A | 2/2004 |
| JP | 2004-281538 A | 10/2004 |
| JP | 2018-500538 A | 1/2018 |

* cited by examiner

Grinding

STACK OF ELECTRICAL COMPONENTS AND METHOD OF PRODUCING THE SAME

The present application is a continuation application of U.S. patent application Ser. No. 16/556,809 filed on Aug. 30, 2019, and claims benefit of priority from, Japanese Patent Application No. 2018-193174 filed on Oct. 12, 2018, the disclosures of which are incorporated herein by reference.

BACKGROUND OF THE INVENTION

Field of the Invention

The present invention relates to a stack of electrical components and a method of producing the same, particularly to a stack of electrical components in which an ASIC (application-specific integrated circuit) and a magnetic sensor are stacked.

Description of the Related Art

A technique is known in which a package is formed by mounting an electrical component, such as an integrated circuit, a semiconductor element, a MEMS and a magnetic sensor, on another electrical component. U.S. Pat. No. 9,466,580 discloses a semiconductor package in which a semiconductor die (hereinafter, referred to as a first electrical component) is mounted on another semiconductor die (hereinafter, referred to as a second electrical component). A pad that is formed on the upper surface of the first electrical component is connected to a pad that is formed on the upper surface of the second electrical component (the surface on which the first electrical component is mounted) via a conductive layer (a redistribution layer). An insulating layer (a passivation layer) is provided on the side surface of the first electrical component, and the conductive layer is formed along the insulating layer. The side surface of the insulating layer is formed in an inclined shape, and the conductive layer is provided along the side surface of the insulating layer thus formed.

SUMMARY OF THE INVENTION

Generally, in order to downsize a stack of electrical components in which a first electrical component is mounted on a second electrical component, it is desirable to downsize the second electrical component. In order to downsize the second electrical component, there may be a need to arrange the pad of the second electrical component close to the first electrical component. If the conductive layer can be arranged along the side surface of the first electrical component, then the required distance between the pad of the second electrical component and the first electrical component is minimized, and the limitation on the downsizing of the second electrical component can be mitigated. However, because the conductive layer has to be bent substantially at right angles at the corner portion that is formed by the upper surface of the second electrical component and the side surface of the first electrical component, the electrical reliability of the conductive layer may deteriorate.

The present invention aims at providing a stack of electrical components in which a conductive layer can be arranged along the side surface of a first electrical component while securing the electrical reliability of the conductive layer, as well as a method of producing the stack of electrical components.

A stack of electrical components of the present invention comprises: a first electrical component having a first surface, a second surface that is opposite to the first surface and a side surface that is located between the first surface and the second surface; a second electrical component having a third surface on which the first electrical component is mounted, the third surface facing the second surface and forming a corner portion between the third surface and the side surface; an adhesive layer that bonds the first electrical component to the second electrical component, the adhesive layer has a first portion that is located between the second surface and the third surface and a second portion that is made of a same material as the first portion and that fills the corner portion; and a conductive layer that extends on a side of the side surface, curves along the second portion and extends to the third surface.

A method of producing a stack of electrical components of the present invention comprises: mounting a first electrical component on a second electrical component, and bonding the first electrical component to the second electrical component by an adhesive layer, wherein the first electrical component has a first surface, a second surface that is opposite to the first surface and side surface that is located between the first surface and the second surface, the second surface of the first electrical component faces a third surface of the second electrical component, and the third surface forms a corner portion between the third surface and the side surface, and providing a conductive layer that extends on a side of the side surface and further extends to the third surface. The adhesive layer is provided such that the adhesive layer has a first portion that is located between the second surface and the third surface, as well as a curved second portion that fills the corner portion, and the conductive layer is provided to curve along the second portion.

According to the present invention, a part of the adhesive layer that bonds the first electrical component to the second electrical component is a curved second portion that fills the corner portion that is formed between the third surface and the side surface, and the conductive layer curves along the second portion. Accordingly, the conductive layer does not need to make a sharp turn at the corner portion. Therefore, the present invention can provide a stack of electrical components in which a conductive layer can be arranged along a side surface of a first electrical component while securing the electrical reliability of the conductive layer, as well as a method of producing the stack of electrical components.

The above and other objects, features and advantages of the present invention will become apparent from the following description with reference to the accompanying drawings which illustrate examples of the present invention.

DETAILED DESCRIPTION OF THE PREFERRED EMBODIMENTS

Hereinafter, embodiments of the present invention will be described with reference to the drawings. The present invention relates to a stack (a package) of electrical components in which a first electrical component is mounted on a second electrical component. In the following embodiments, the first electrical component is a magnetic sensor, and the second electrical component is an ASIC (application-specific integrated circuit) that is connected to the magnetic sensor, but the present invention is not limited to this.

First Embodiment

Figure 1A:
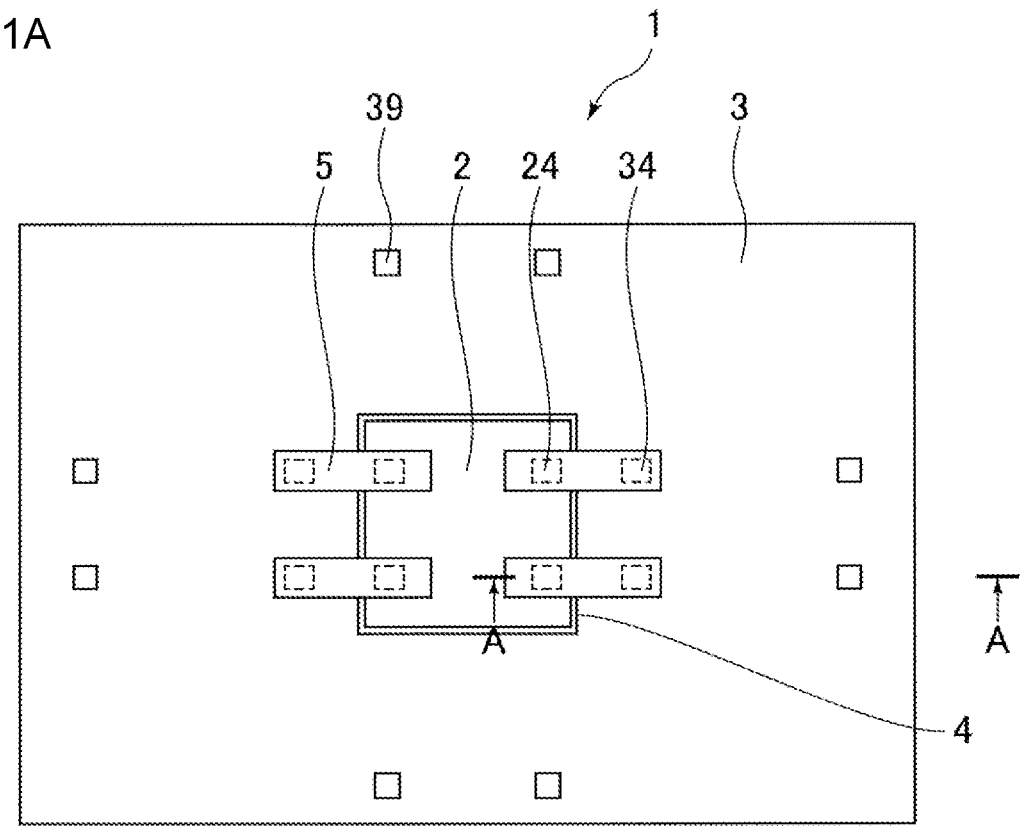
FIGS. 1A and 1B are a top view and a cross-sectional view illustrating a stack of electrical components according to a first embodiment, respectively.
Figure 1B:
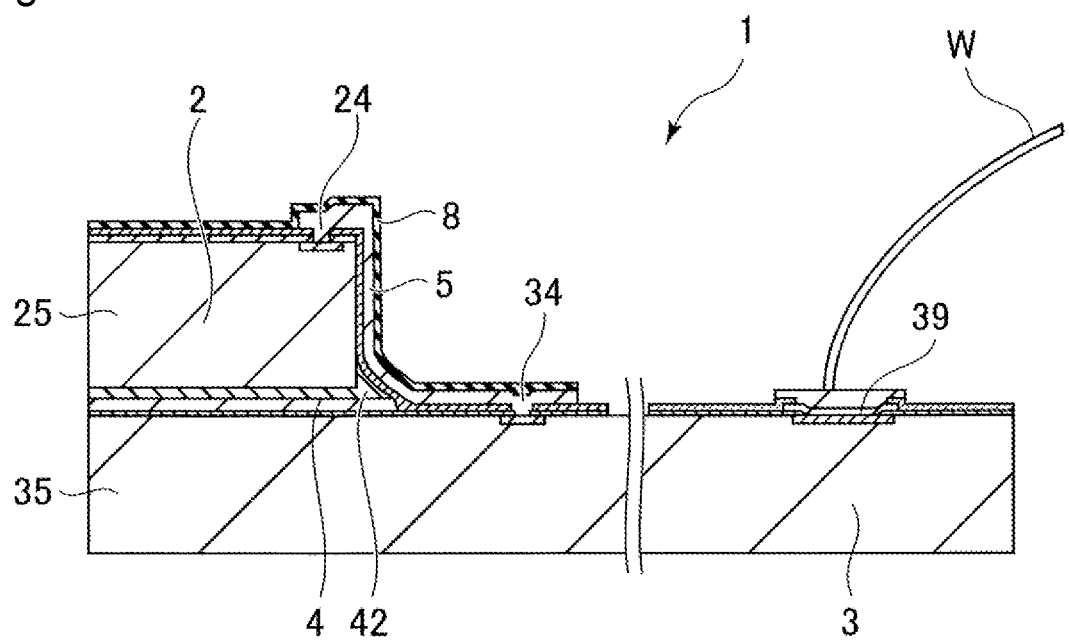
Figure 2:
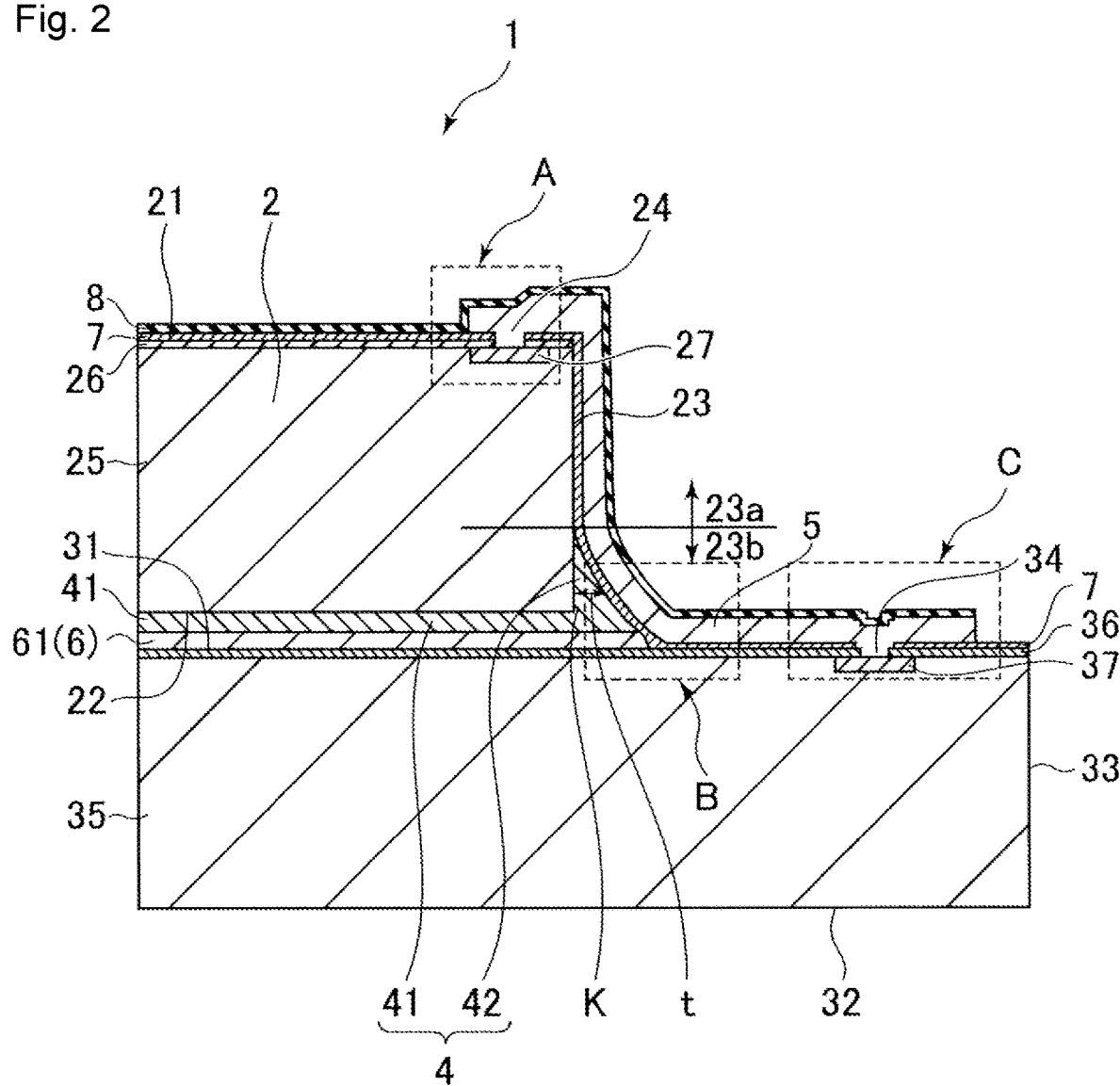
FIG. 2 is a cross-sectional view illustrating the stack in FIGS. 1A and 1B in more detail.
Figure 3A:
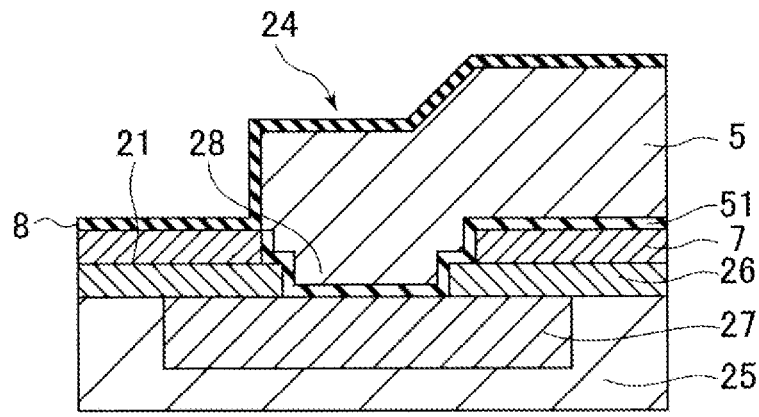
FIGS. 3A to 3C are partial cross-sectional views illustrating the stack in FIGS. 1A and 1B in more detail.
Figure 3B:
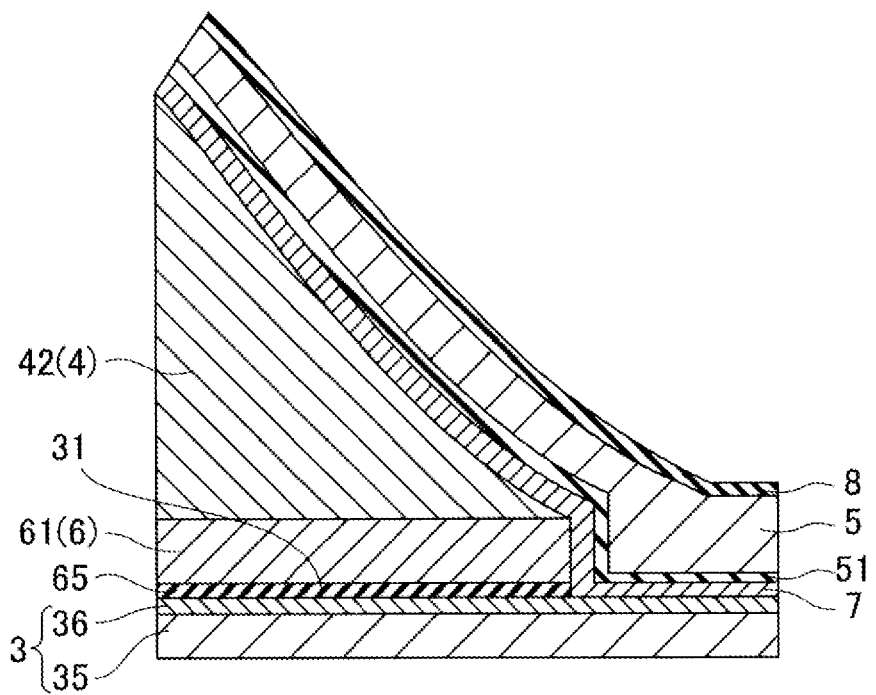
Figure 3C:
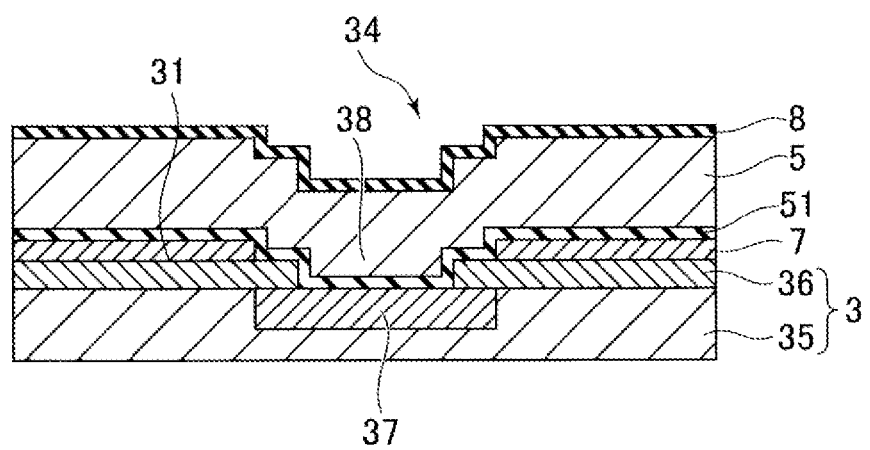

FIG. 1A is a top view illustrating a stack of electrical components (hereinafter, referred to as stack 1), and FIG. 1B is a cross-sectional view illustrating stack 1 taken along line A-A in FIG. 1A. FIG. 2 is a cross-sectional view illustrating stack 1 in more detail, and FIGS. 3A to 3C are partial cross-sectional views illustrating portion A, portion B, and portion C in FIG. 2 in more detail, respectively.

First electrical component 2 has an approximately rectangular parallelepiped shape. First electrical component 2 has first surface 21, second surface 22 that is a surface opposite to first surface 21 and first side surfaces 23 that are located between first surface 21 and second surface 22. First electrical component 2 has first electrical connections 24 on first surface 21. First electrical component 2 has first substrate 25 made of silicon, as well as first passivation layer 26 that is provided on first substrate 25. A sensor element, such as a TMR element (not illustrated), is formed in first substrate 25. First passivation layer 26 is an insulating layer that protects first substrate 25, and first surface 21a is formed by the surface of first passivation layer 26. In each first electrical connection 24, first pad 27 is formed on the surface of first substrate 25, and first passivation layer 26 includes first opening 28 that exposes first pad 27.

Second electrical component 3 has an approximately rectangular parallelepiped shape. Second electrical component 3 has third surface 31, fourth surface 32 that is a surface opposite to third surface 31 and second side surfaces 33 that are located between third surface 31 and fourth surface 32. Third surface 31 of second electrical component 3 faces second surface 22 of first electrical component 2. A part of third surface 31 works as the mounting surface on which first electrical component 2 is mounted, and first electrical component 2 is bonded to second electrical component 3 via adhesive layer 4 on the mounting surface. Second electrical connections 34 are provided on third surface 31 at positions different from the mounting surface. Second electrical component 3 has second substrate 35 made of silicon, as well as second passivation layer 36 that is provided on second substrate 35. An element, such as an IC (not illustrated), is formed in second substrate 35. Second passivation layer 36 is an insulating layer that protects second substrate 35, and third surface 31 is formed by the surface of second passivation layer 36. In each second electrical connection 34, second pad 37 is formed on the surface of second substrate 35, and second passivation layer 36 has second opening 38 that exposes second pad 37. Second electrical component 3 is larger than first electrical component 2, and third surface 31 of second electrical component 3 is larger than second surface 22 of first electrical component 2. Specifically, second surface 22 of first electrical component 2 is located inside the circumference of third surface 31 of second electrical component 3. Accordingly, corner portion K having approximately right angles is formed between third surface 31 of second electrical component 3 and first side surface 23 of first electrical component 2. As described later, second electrical connections 34 are connected to first electrical connections 24 via conductive layers 5. External connecting pads 39 for connection to the outside are provided near the circumference of third surface 31 of second electrical component 3. As illustrated in FIG. 1B, stack 1 is connected to another device via wire W that is connected to external connecting pad 39.

Adhesive layer 4 is made of a silicone resin. Due to the high heat-resisting capability, adhesive layer 4 can withstand heat treatment at a high temperature in the wafer process. Adhesive layer 4 has first portion 41 that is located between second surface 22 and third surface 31, as well as curved-shaped second portion 42 that fills corner portion K. First portion 41 mainly has the function of bonding first electrical component 2 to second electrical component 3. A part of second portion 42 is formed of a liquid resin that is provided outside first electrical component 2 in advance, and the remaining portion is formed of a resin that is forced out of the space between second surface 22 and third surface 31 when first electrical component 2 is bonded to second electrical component 3. Accordingly, second portion 42 is formed on the side of first portion 41, as well as in the region of first side surface 23 that is close to third surface 31 (hereinafter, referred to as lower portion 23b). Since the resin goes up along first side surface 23 due to surface tension thereof, a part of adhesive layer 4 (not illustrated) is also formed in the region of first side surface 23 between second portion 42 and first surface 21 (hereinafter, referred to as upper portion 23a), although the amount of the resin thus formed is limited. In the present invention, it is not essential whether a part of adhesive layer 4 is formed in upper portion 23a, and the amount of adhesive layer 4 that is formed in upper portion 23a is not essential. The boundary between upper portion 23a and lower portion 23b is located closer to third surface 31 than the midpoint of first side surface 23 in the height direction, but the boundary may also be located closer to first surface 21 than the midpoint.

Suppose that thickness t of second portion 42 is defined as a thickness that is measured along a normal line to first side surface 23 in the region of first side surface 23, and is defined as a thickness that is measured along a normal line to an extension of first side surface 23 in the region between first electrical component 2 and second electrical component 3. Thickness t of second portion 42 thus defined monotonically increases toward third surface 31 of second electrical component 3. In addition, the rate of increase of thickness t monotonically increases toward third surface 31 in at least the area that is closer to third surface 31 than the center of first side surface 23 in the thickness direction (the middle position equidistant both from first surface 21 and third surface 31). In other words, second portion 42 has a curved shape that is concave toward corner portion K near corner portion K, and substantially has a cross-section of a right triangle having a curved hypotenus protruding toward corner portion K.

Holding means 6 for holding adhesive layer 4 is formed between third surface 31 and adhesive layer 4. To be more exact, holding means 6 holds a liquid adhesive (resin) that is cured to be converted into adhesive layer 4. In the present embodiment, wettability control layer 61 having larger wettability than third surface 31 is formed as holding means 6. Wettability control layer 61 is formed between adhesive layer 4 and third surface 31. The wettability refers to the tendency of a liquid to be wettable on a solid surface. The smaller the contact angle (an angle formed between a surface of stationary liquid and a solid surface where the free surface of the liquid meets the solid wall) is, the higher is the wettability. Wettability control layer 61 is a metal layer (a metal land) that is formed on third surface 31 and that forms a step between the layer and third surface 31. Specifically, wettability control layer 61 forms a portion that protrudes toward first electrical component 2 from the surrounding third surface 31. Wettability control layer 61 is, for example, made of metal, such as Cu, but may be formed of any material that can hold a liquid resin that is to be converted into adhesive layer 4. In the present embodiment, wettability control layer 61 is formed by plating, and second seed layer 65 for the plating of wettability control layer 61 is provided between second passivation layer 36 and wettability control layer 61. Second seed layer 65 is made of Cu and may be formed by sputtering. When wettability control layer 61 is formed by sputtering, CVD, or the like, second seed layer 65 is not necessary. The circumference of wettability control layer 61 is formed outside the circumference of first electrical component 2 along the entire circumference thereof, as viewed in the direction perpendicular to third surface 31.

A part of second portion 42 is formed of a resin that is forced out of the space between second surface 22 and third surface 31. Therefore, the resin preferably has a viscosity as low as possible in order to form second portion 42 with high accuracy and with high reproducibility of shape. However, if a resin having a low viscosity is used, then the resin may spread extensively on third surface 31. Because wettability control layer 61 has a larger wettability than third surface 31, the area where the applied resin spreads is limited within the circumference of wettability control layer 61. A step is formed between wettability control layer 61 and third surface 31 such that wettability control layer 61 is on the upper side and third surface 31 is on the lower side. Accordingly, the area where the applied resin spreads is also limited by the surface tension that is generated along the circumference of wettability control layer 61.

Figure 4A:
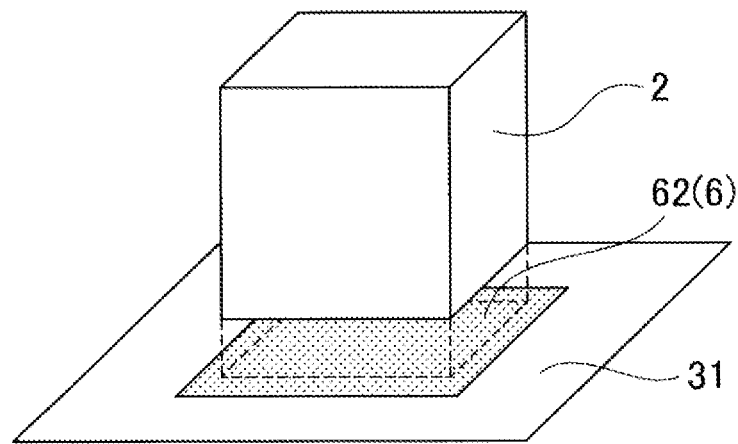
FIGS. 4A to 4C are perspective views illustrating various modifications of the holding means.
Figure 4B:
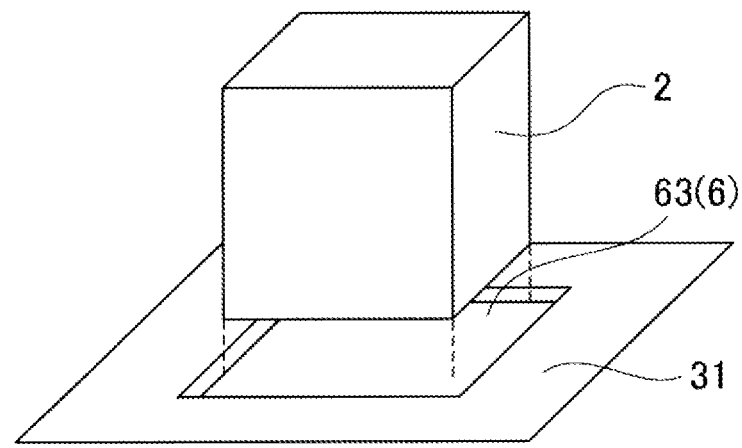
Figure 4C:
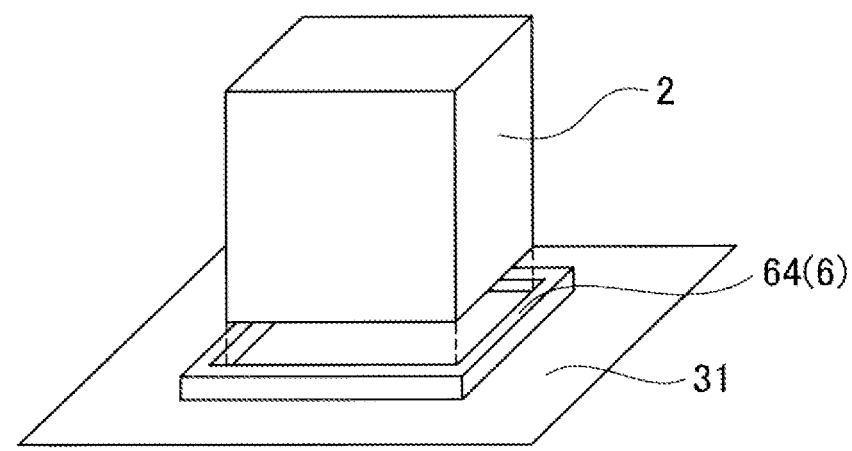

Holding means 6 is not limited to the arrangement described above, and may be modified in various manners. For example, as illustrated in FIG. 4A, holding unit 6 may be holding surface 62 for an adhesive layer that is formed on third surface 31 and that has a larger wettability than the other portions of third surface 31. Holding surface 62 having a larger wettability than third surface 31 may be formed by rough surface finishing of third surface 31. In this modification, a step between holding surface 62 and third surface 31 is not necessary. As illustrated in FIG. 4B, holding means 6 may be recess 63 that is recessed from third surface 31 in a direction away from first electrical component 2. In this modification, recess 63 holds the adhesive, and the wettability of the bottom surface of recess 63 is not limited. As illustrated in FIG. 4C, holding means 6 may be frame member 64 that is provided on third surface 31. In this modification, frame member 64 holds the adhesive, and the wettability of the bottom surface inside frame member 64 is not limited. Furthermore, although not illustrated, wettability control layer 61 may be embedded in second passivation layer 36 such that wettability control layer 61 is flush with third surface 31.

As illustrated in FIGS. 1A, 1B and 2, first electrical connections 24 (first pads 27) are connected to second electrical connections 34 (second pads 37) via conductive layers 5 (redistribution layers). Conductive layers 5 are strip-shaped metal layers that connect first electrical connections 24 to second electrical connections 34. In the present embodiment, four conductive layers 5 are provided, but the number of conductive layers 5 is not limited to this. Each conductive layer 5 extends from first electrical connection 24 to second electrical connection 34 along first surface 21, then along second portion 42 of adhesive layer 4 (that is, extends on the side of first side surface 23 toward third surface 31), then along third surface 31 of second electrical component 3. In the present embodiment, each conductive layer 5 terminates at second electrical connection 34. In upper portion 23a of first side surface 23, conductive layer 5 substantially extends along first side surface 23. Conductive layer 5 is made of Cu, but may be made of other conductive materials, such as Au, Ag and Al. In the present embodiment, conductive layer 5 is formed by plating, but may be formed by other methods, such as sputtering and CVD. Conductive layer 5 curves along second portion 42, which is formed in a curved shape near corner portion K, and therefore conductive layer 5 does not sharply change the direction. This makes it easy to secure the electrical reliability of conductive layer 5.

First insulating layer 7 is provided both between conductive layer 5 and first side surface 23 and between conductive layer 5 and first surface 21 in order to secure electrical insulation between conductive layer 5 and first substrate 25. First insulating layer 7 is also provided between conductive layer 5 and third surface 31. First insulating layer 7 is made of $SiO_2$, SiN, AlO, or the like, and may be formed by CVD. First seed layer 51 is provided on the outer surface of first insulating layer 7 for the plating of conductive layer 5. First seed layer 51 is made of Cu and may be formed by sputtering. When conductive layer 5 is formed by sputtering, CVD, or the like, first seed layer 51 is not necessary. The outer surface of conductive layer 5 is covered with and protected by third passivation layer 8. As illustrated in FIG. 3A, first opening 28 to expose first pad 27 is provided both in first passivation layer 26 and in first insulating layer 7 around first electrical connection 24, and first seed layer 51 is also formed on the side wall of first opening 28, as well as on first pad 27. Thus, the electrical connection between conductive layer 5 and first pad 27 can be established. Similarly, as illustrated in FIG. 3C, second opening 38 to expose second pad 37 is provided both in second passivation layer 36 and in first insulating layer 7 around second electrical connection 34, and first seed layer 51 is also formed on the side wall of second opening 38, as well as on second pad 37. Thus, the electrical connection between conductive layer 5 and second pad 37 can be established.

Figure 5A:
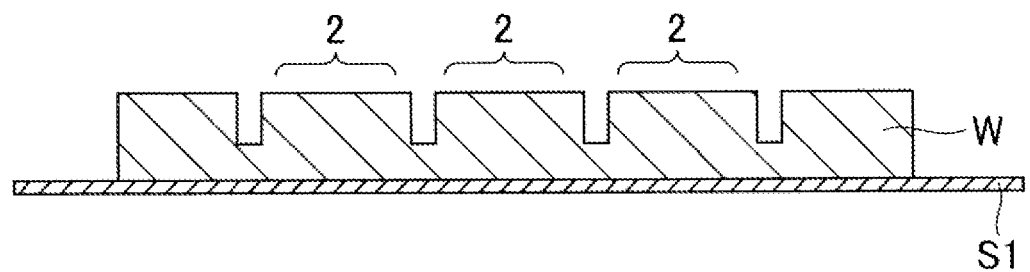
FIGS. 5A to 5C are process diagrams schematically illustrating a method of producing the first electrical component.
Figure 5B:
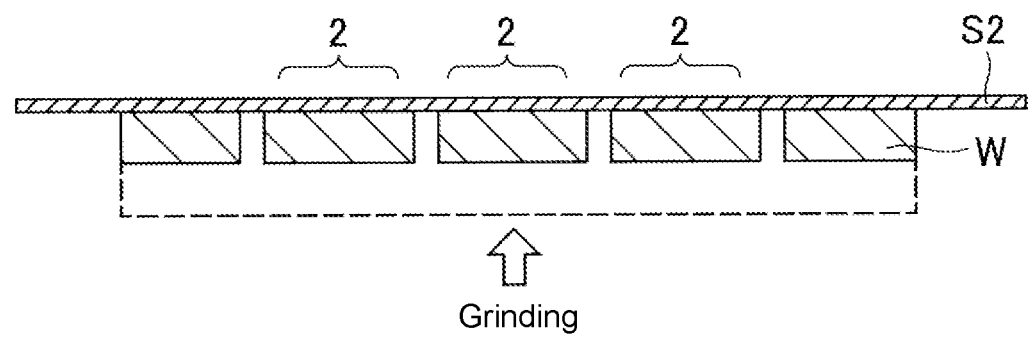
Figure 5C:
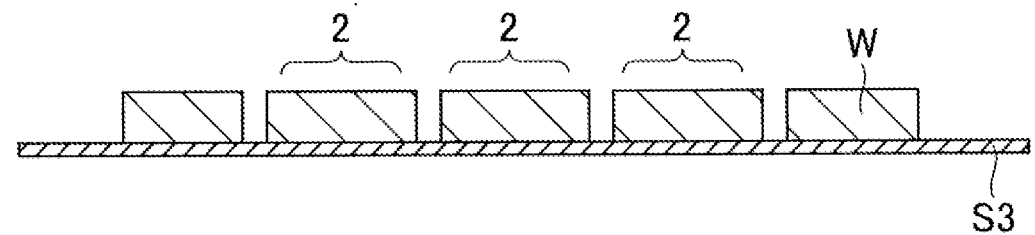

Next, a method of producing above-described stack 1 will be described. In this producing method, first electrical components 2 and second electrical components 3 are formed in different wafer processes (formed on different wafers), and first electrical component 2 that is separated is mounted on second electrical component 3 that is provided on the wafer. First, as illustrated in FIG. 5A, wafer W on which a plurality of first electrical components 2 are formed is attached to adhesive sheet S1 for fixation. Adhesive sheet S1 is attached to the surface of the wafer opposite to the surface (second surface 22) on which first electrical connection 24 is formed. First electrical components 2 are cut halfway in the thickness of wafer W (half cutting) from the back surface of first electrical components 2, as viewed from adhesive sheet S1. Next, as illustrated in FIG. 5B, adhesive sheet S1 is removed, wafer W is turned upside down and is attached to another adhesive sheet S2 for fixation. That is, first electrical components 2 are attached to another adhesive sheet S2 such that the surfaces of first electrical components 2 that have been cut contact adhesive sheet S2. In this state, the surfaces of first electrical components 2 that have not been cut are ground in order to thin first electrical components 2 until no uncut portion remains. Thus, first electrical components 2 are separated on adhesive sheet S2. By using such a cutting method that involves the half cutting, chipping can be prevented during the cutting process even when first electrical components 2 are thinned. Next, as illustrated in FIG. 5C, another adhesive sheet S3 is attached, wafer W is turned upside down, and adhesive sheet S2 is removed. Thus, first electrical components 2 that are separated can be picked up and can be easily mounted on respective second electrical components 3. When a device is used that can directly mount first electrical component 2 on second electrical component 3 in the state illustrated in FIG. 5B, the process illustrated in FIG. 5C can be omitted.

Figure 6A:
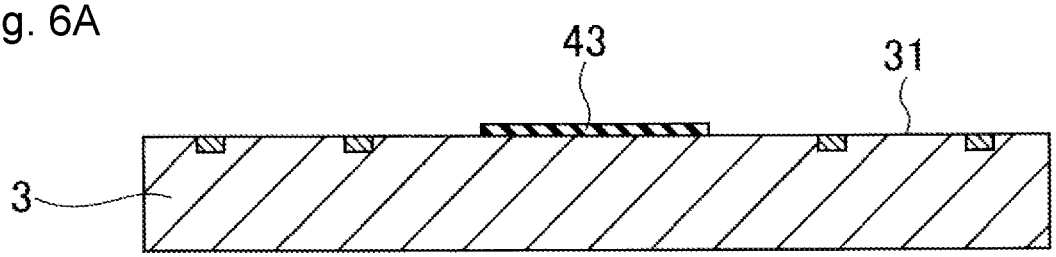
FIGS. 6A to 6D are process diagrams schematically illustrating a method of producing the stack according to the first embodiment.
Figure 6B:
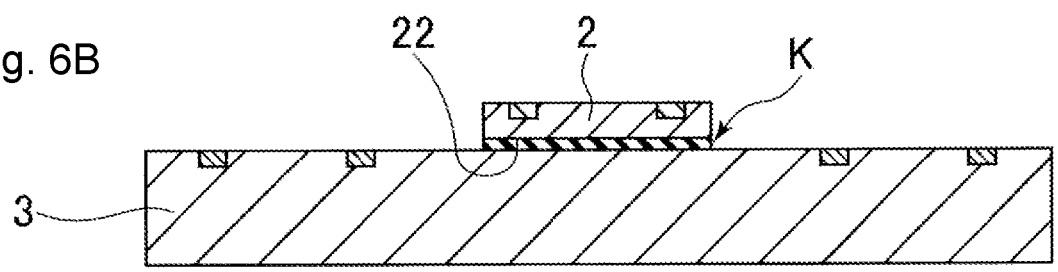

Next, as illustrated FIG. 6A, adhesive 43 is applied to third surface 31 of each second electrical component 3 on the wafer. Adhesive 43 is a liquid resin. Specifically, second seed layer 65 is formed on second passivation layer 36 of second electrical component 3, and wettability control layer 61 is formed on second seed layer 65 by plating (not illustrated in FIG. 6A, see FIGS. 2 and 3B). Next, liquid adhesive 43 is applied to wettability control layer 61. Adhesive 43 spreads to cover the upper surface of wettability control layer 61. Adhesive 43 does not cover the entire upper surface of wettability control layer 61, but preferably spreads on the upper surface of wettability control layer 61 over the area that allows the entire bottom surface of first electrical component 2 to contact adhesive 43. In other words, the area of second surface 22 of first electrical component 2 is smaller than the area where adhesive 43 spreads. This enables second portion 42 to be formed along the entire circumference of second surface 22 of first electrical component 2. Adhesive 43 may cover the entire upper surface of wettability control layer 61. Because the area of wettability control layer 61 is larger than the area of second surface 22 of first electrical component 2, second portion 42 is formed along the entire circumference of second surface 22 of first electrical component 2. It should be noted that a plurality of second electrical components 3 is formed on the wafer, although only one second electrical component 3 is illustrated in FIGS. 6A to 6D. Next, as illustrated in FIG. 6B, first electrical component 2 is mounted on wettability control layer 61 that is covered with adhesive 43. Second surface 22 of first electrical component 2 faces third surface 31 of second electrical component 3, and corner portion K is formed between third surface 31 of second electrical component 3 and first side surface 23 of first electrical component 2. A part of adhesive 43 is forced out of the space between second surface 22 and third surface 31 due to the weight of first electrical component 2 or by controlling pressing force, and goes up along first side surface 23 (see FIG. 2). Thus, second portion 42 is formed. The reproducibility of the shape of second portion 42 can be secured by adjusting the amount of adhesive 43, the moving velocity of first electrical component 2, the pressing force and so on. When a thermosetting resin is used as adhesive 43, first electrical component 2 is bonded to second electrical component 3 by heating the resin in order to form second portion 42. Adhesive 43 is then cured to be converted into adhesive layer 4.

Figure 6C:
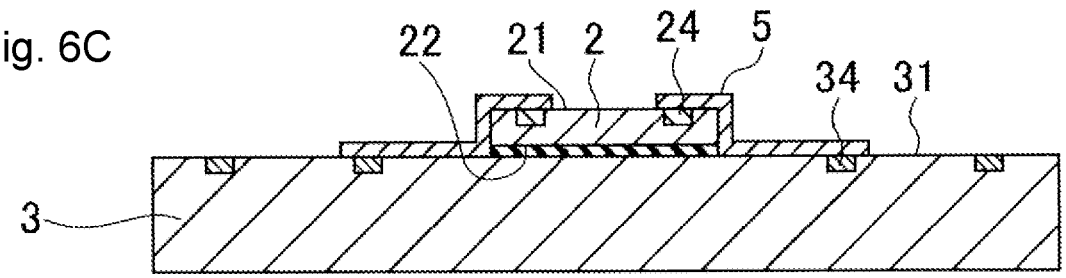
Figure 6D:
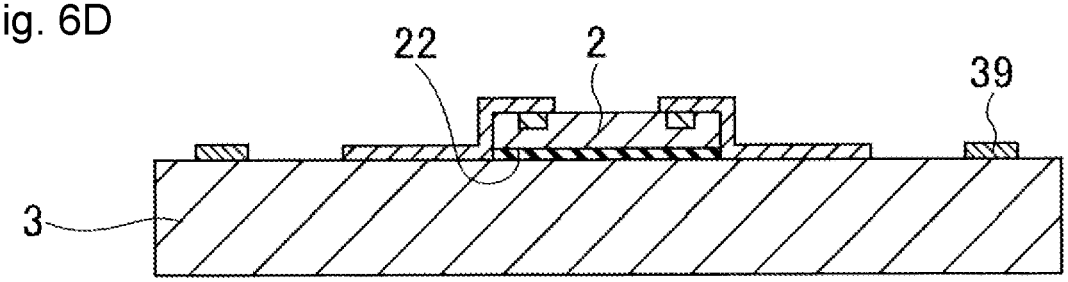

Next, as illustrated in FIG. 6C, conductive layer 5 that connects first electrical connection 24 on first surface 21 to second electrical connection 34 on third surface 31 is formed. Specifically, first insulating layer 7 (see FIGS. 2, and 3A to 3C) is formed first on first surface 21 and first side surface 23 of first electrical component 2, as well as on third surface 31 of second electrical component 3. First insulating layer 7 may be formed, for example, by CVD. In this case, the surface of adhesive layer 4 is also covered with first insulating layer 7. Next, the portions of first insulating layer 7 immediately above first and second pads 27 and 37 are removed in order to expose first and second pads 27 and 37. Then, conductive layer 5 is formed according to the following processes. First seed layer 51 is formed first on first insulating layer 7, as well as on first and second pads 27 and 37 that have been exposed. Next, a resist is formed on first seed layer 51, and the portion of the resist on which conductive layer 5 is to be formed is removed by patterning in order to expose first seed layer 51. Then, the wafer is immersed in a plating bath in order to plate the portion of first seed layer 51 that has been exposed. Since the plating is formed in a curved shape along second portion 42, conductive layer 5 can gradually change the direction from first side surface 23 of first electrical component 2 toward third surface 31 of second electrical component 3, as described above. Then, the resist is removed, and the portion of first seed layer 51 that has not been plated is removed by means of milling, or the like. Subsequently, third passivation layer 8 is formed on conductive layer 5. Third passivation layer 8 may be formed, for example, by CVD. As illustrated in FIG. 6D, external connecting pad 39 is then formed on third surface 31 of second electrical component 3. Thereafter, the wafer, on which second electrical components 3 are formed, is cut in order to separate stacks 1, although not illustrated.

Next, the advantages of the present embodiment will be described. Corner portion K that is formed by first electrical component 2 and second electrical component 3 is a portion where it is difficult to form a metal layer and to secure the electrical reliability of conductive layer 5, regardless of how conductive layer 5 is formed (that is, regardless of whether conductive layer 5 is formed by plating or whether formed by a method other than plating, such as sputtering). In the present embodiment, second portion 42 of adhesive layer 4 is formed outside first electrical component 2. Since second portion 42 is formed in a curved shape, it is possible to gradually change the direction of conductive layer 5 near corner portion K by forming conductive layer 5 along second portion 42. Accordingly, in the present embodiment, the electrical reliability of conductive layer 5 can be easily secured.

Indeed, a member other than an adhesive can be used in order to form a curved portion in corner portion K, if possible. However, using such a member may complicate the manufacturing process and affect the cost. In the present embodiment, a liquid resin that is used to bond first electrical component 2 to second electrical component 3 is used to provide the curved portion in corner portion K, and no additional member is required. In addition, the deformation of the resin occurs concurrently when first electrical component 2 is mounted on second electrical component 3, and no special step for deforming the resin is required. In other words, adhesive layer 4 (adhesive 43) of the present embodiment is not only used to bond first electrical component 2 to second electrical component 3, but is also used as a supporting layer for conductive layer 5 by forcing adhesive layer 4 (adhesive 43) out of first electrical component 2.

Furthermore, since conductive layer 5 can be substantially formed along first side surface 23 of first electrical component 2, second electrical connection 34 of second electrical component 3 can be arranged near first electrical component 2. Thus, the limitation on the position of second electrical connection 34 is mitigated, and second electrical component 3, as well as stack 1 (package), can be downsized. The downsizing of second electrical component 3 leads to an increase in the number of second electrical components 3 obtained per wafer.

Figure 7A:
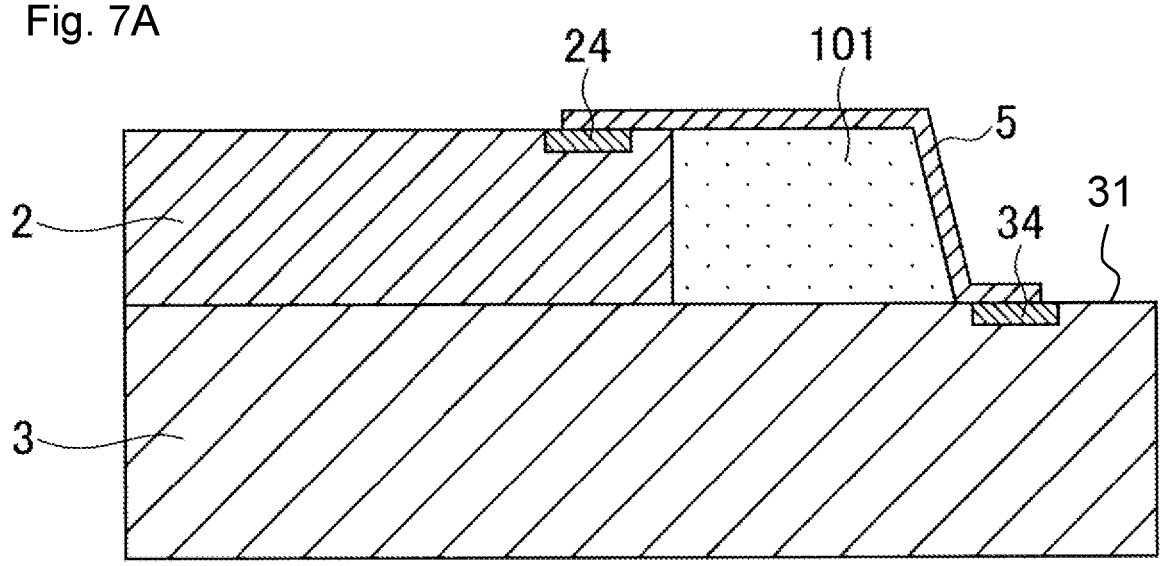
FIGS. 7A and 7B are diagrams illustrating the advantages of the stack according to the first embodiment.
Figure 7B:
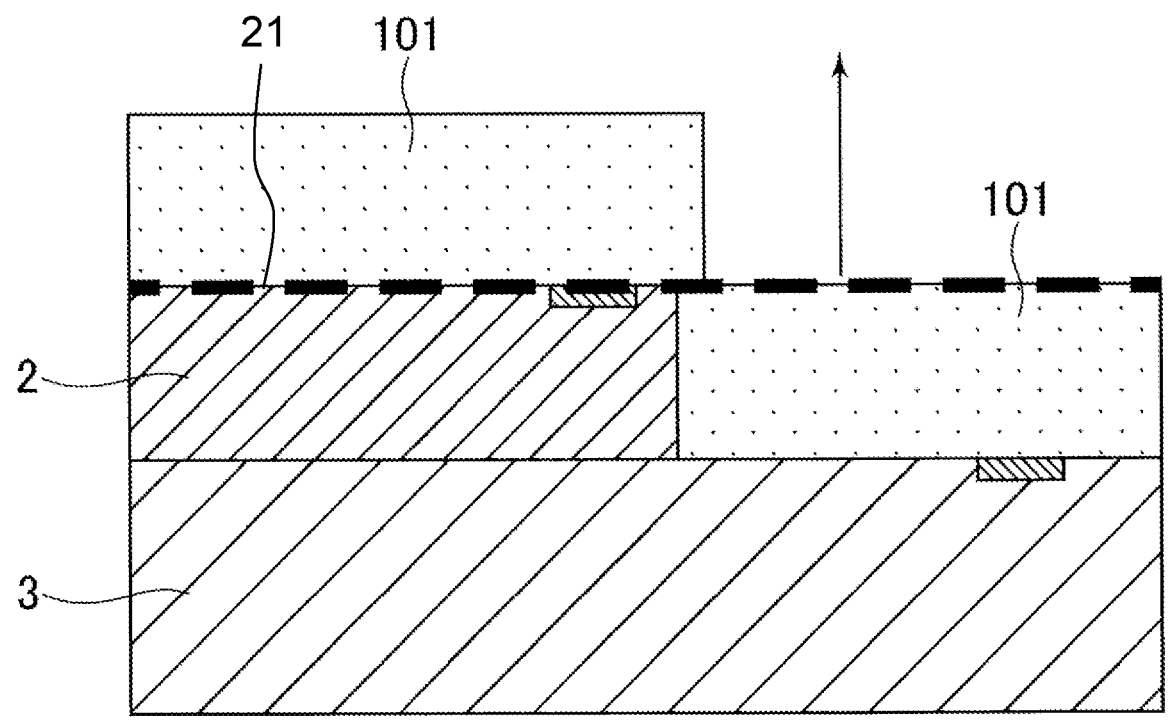

First insulating layer 7 is a thin film that is formed on first surface 21 and first side surface 23 of first electrical component 2, as well as on third surface 31 of second electrical component 3. This leads to a further advantage in the producing process. FIGS. 7A and 7B are cross-sectional views schematically illustrating the stack that is disclosed in U.S. Pat. No. 9,466,580. As illustrated in FIG. 7A, inclined insulating layer 101 is formed on the side surface of first electrical component 2, and conductive layer 5 is formed along the inclined side surface. Since the thickness of insulating layer 101 that is formed on third surface 31 is substantially the same as the height of first electrical component 2, insulating layer 101 having substantially the same height as the height of first electrical component 2 is formed on first surface 21 of first electrical component 2, as illustrated in FIG. 7B. Accordingly, the portion of insulating layer 101 above the dashed line needs to be removed in advance in order to form conductive layer 5 on first surface 21. In contrast, such a large step is not generated in first insulating layer 7 in the present embodiment. The process of making first insulating layer 7 flat is not necessary, and the process can be simplified.

Furthermore, first seed layer 51 to form conductive film 5 is also formed in portions other than the portion where conductive film 5 is formed. Thus, first seed layer 51 in the former needs to be removed after the process of plating conductive film 5 is completed (after the resist is removed). It is very difficult to remove first seed layer 51 when corner portion K forms right angles, but in the present embodiment, the boundary between first electrical component 2 and second electrical component 3 is formed in a curved shape by adhesive layer 4, and first seed layer 51 can be easily removed.

Second Embodiment

Figure 8:
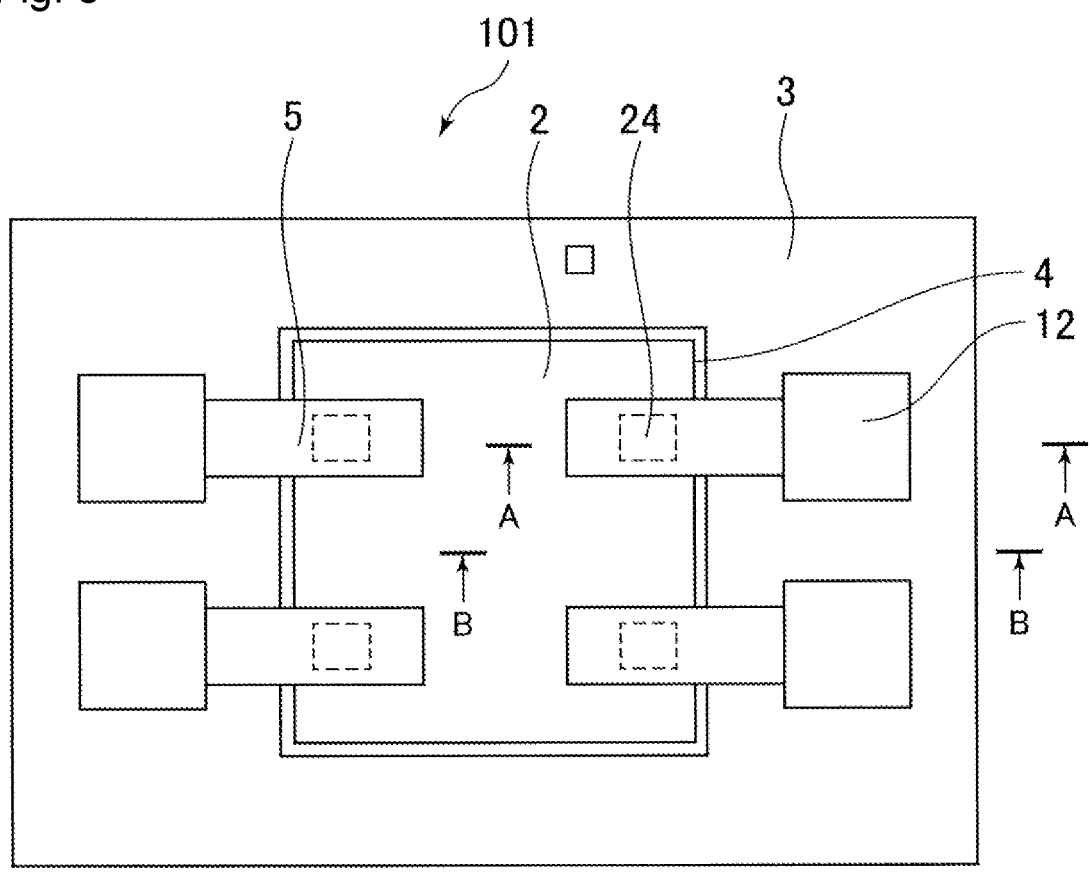
FIG. 8 is a top view illustrating the stack of electrical components according to a second embodiment.
Figure 9A:
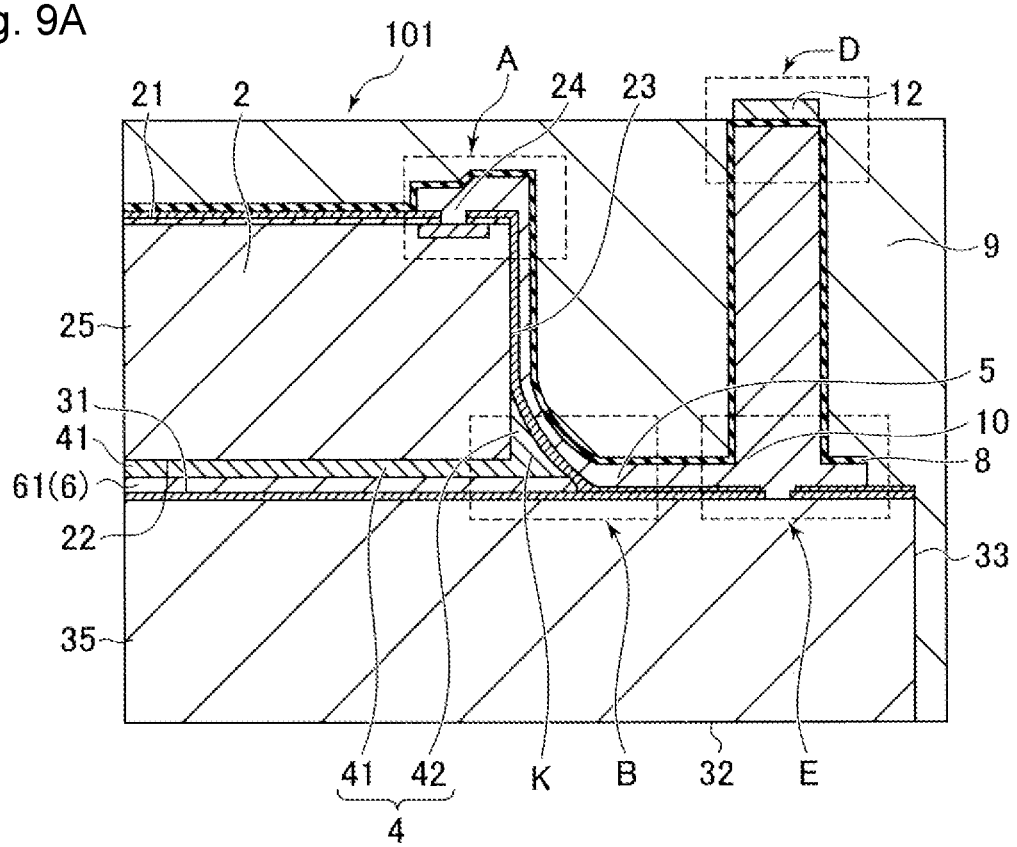
FIGS. 9A and 9B are cross-sectional views illustrating the stack in FIG. 8.
Figure 9B:
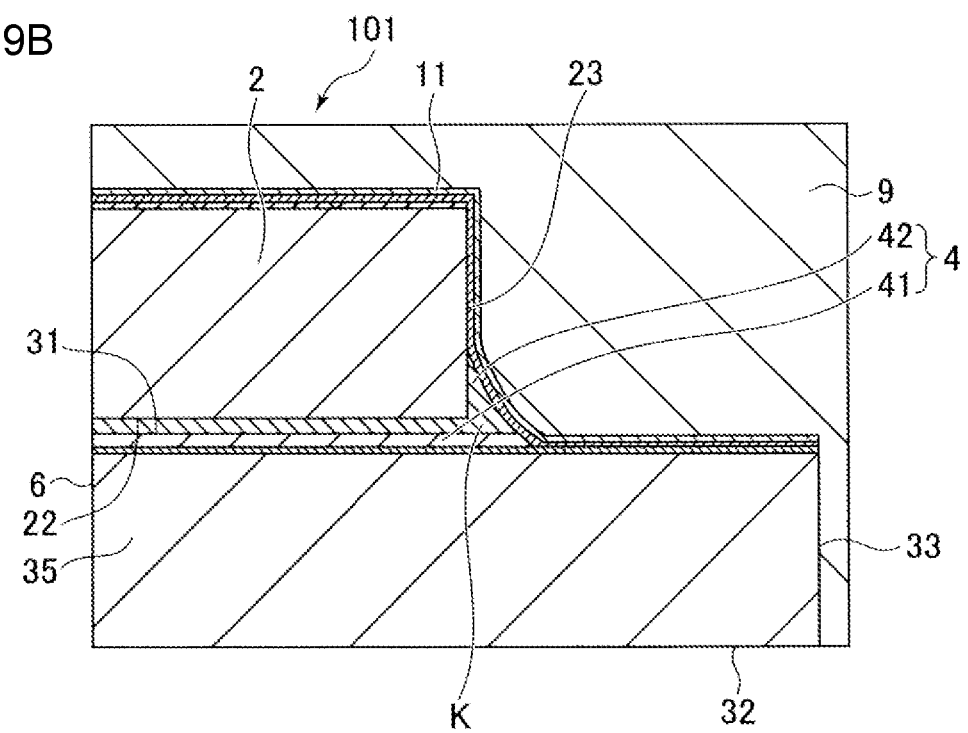
Figure 10A:
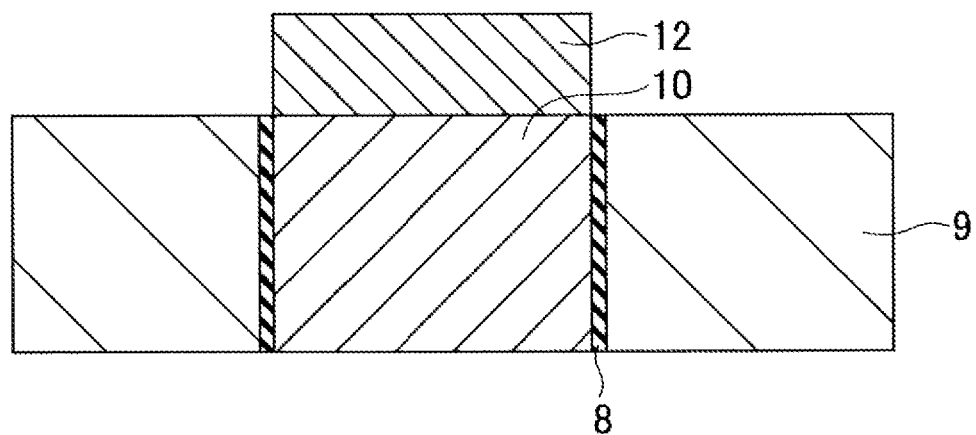
FIGS. 10A and 10B are partial cross-sectional views illustrating the stack in FIG. 8 in more detail.
Figure 10B:
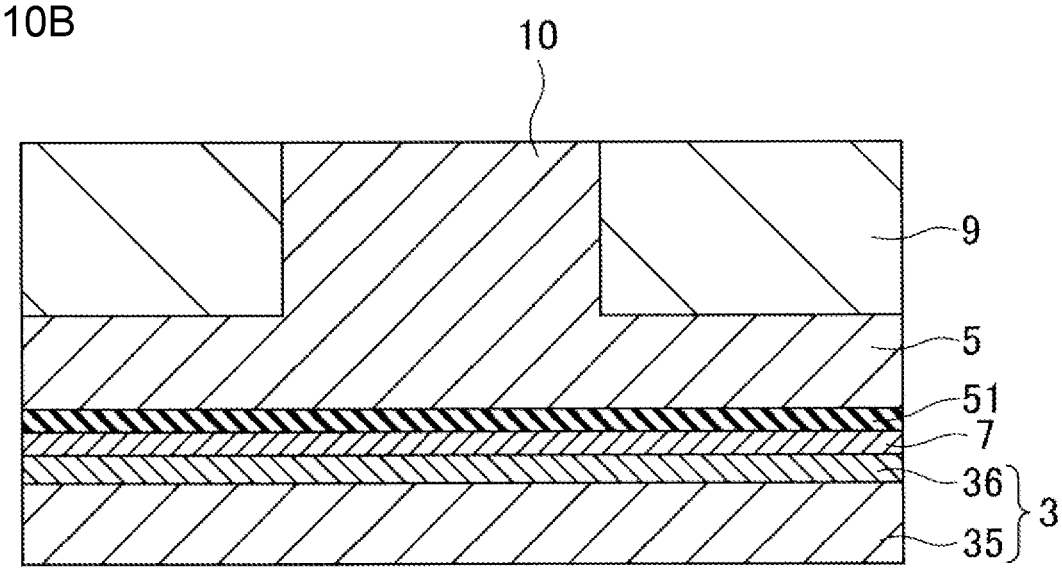

Stack 101 according to the second embodiment will be described with reference to FIGS. 8 to 11G. Hereinafter, differences from the first embodiment will be mainly described. The configuration and effects that are not particularly mentioned are the same as those of the first embodiment. FIG. 8 is a top view illustrating stack 101 according to the second embodiment, and FIGS. 9A and 9B are cross-sectional views of stack 101 taken along line A-A and line B-B of FIG. 8, respectively. FIGS. 10A and 10B are partial cross-sectional views illustrating portion D and portion E in FIG. 9A in more detail, respectively. It should be noted that portion A and portion B in FIG. 9A are the same as in the first embodiment. Refer to FIG. 3A to 3C and the above-mentioned description.

In the present embodiment, second portion 42 of adhesive layer 4 and conductive layer 5 are covered with molding material 9 that is made of an epoxy resin. Conductive pillar 10 is connected to conductive layer 5. Conductive pillar 10 bypasses second electrical component 3 in order to directly takes out the output of first electrical component 2. When pillar 10 is arranged immediately above first electrical component 2, stress that is generated when pillar 10 is connected to an external connecting portion (a solder ball, a wire, or the like) may be directly applied to first electrical component 2 through pillar 10. When first electrical component 2 is a magnetic sensor or a semiconductor element, the output may vary due to the influence of the stress. This problem can be prevented by arranging pillar 10 outward of first electrical component 2. Pillar 10 is made of the same material (Cu) as conductive layer 5. The configurations of first electrical component 2, conductive layer 5 and adhesive layer 4 are the same as in the first embodiment. On the other hand, as illustrated in FIG. 9A and 10B, second electrical component 34 is not provided. In the connecting portion between pillar 10 and conductive layer 5, second passivation layer 36 is provided on second substrate 35, and first insulating layer 7, fist seed layer 51 and conductive layer 5 are provided on second passivation layer 36 in this order. As illustrated in FIGS. 9A and 10A, conductive terminal 12 for external connection is provided on the top end of pillar 10. Pillar 10 is covered with third passivation layer 8 along the circumference thereof.

As illustrated in FIG. 9B, third insulating layer 11 is provided between second portion 42 of adhesive layer 4 and molding material 9. Due to the poor adhesivity between the epoxy resin, which is the material of molding material 9, and the silicone resin, which is the material of adhesive layer 4, the epoxy resin easily peels off from the silicone resin. Third insulating layer 11 prevents adhesive layer 4 from directly contacting molding material 9, thereby reducing the possibility of molding material 9 peeling off from adhesive layer 4.

An epoxy resin is used as molding material 9 in the present embodiment, but the epoxy resin may also be used as a coating film for second portion 42 of adhesive layer 4. In this case also, third insulating layer 11 is preferably provided between the coating film made of the epoxy resin and second portion 42 of adhesive layer 4. Furthermore, third insulating layer 11 directly covers second portion 42 of adhesive layer 4 in the present embodiment, but may indirectly cover second portion 42 via another layer.

Next, a method of producing above-described stack 101 of electrical components will be described. In this producing method also, first electrical components 2 and second electrical components 3 are formed in different wafer processes (formed on different wafers), and first electrical component 2 that is separated is mounted on second electrical component 3 that is provided on the wafer. First electrical component 2 is produced in the same manner as in the first embodiment. Refer to FIG. 5A to 5C and the above-mentioned description.

Figure 11A:
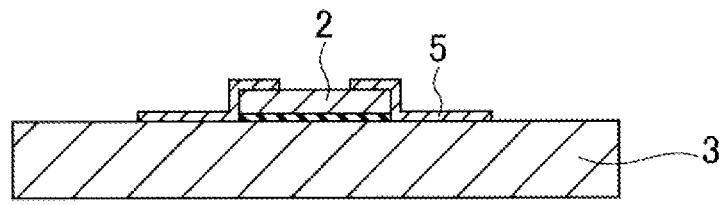
FIGS. 11A to 11G are process diagrams schematically illustrating a method of producing the stack according to the second embodiment.
Figure 11B:
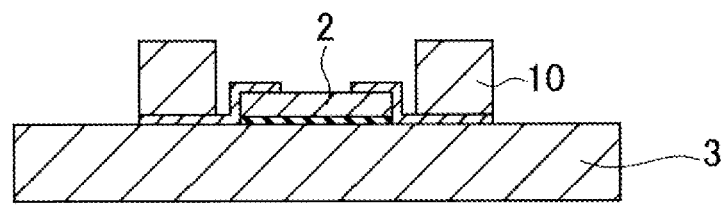

Next, as illustrated in FIG. 11A, first electrical component 2 is bonded onto second electrical component 3, and conductive layer 5 is then formed. This process can be conducted in the same manner as in the first embodiment. Refer to FIG. 6A to 6D and the above-mentioned description. It should be noted that second electrical connections 34 and external connecting pads 39, both illustrated in FIGS. 6A to 6D, are not provided in the present embodiment. Third passivation layer 8 is not formed at this stage. Next, as illustrated in FIG. 11B, pillar 10 is formed on conductive layer 5 by plating. First seed layer 51 is not necessary because pillar 10 is formed on conductive layer 5. After pillar 10 is formed, third passivation layer 8 is formed on conductive layer 5 and around pillar 10.

Figure 11C:
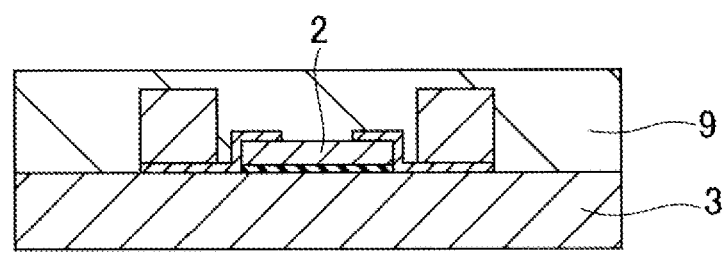
Figure 11D:
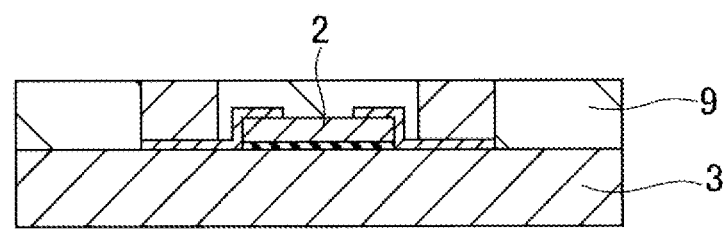
Figure 11E:
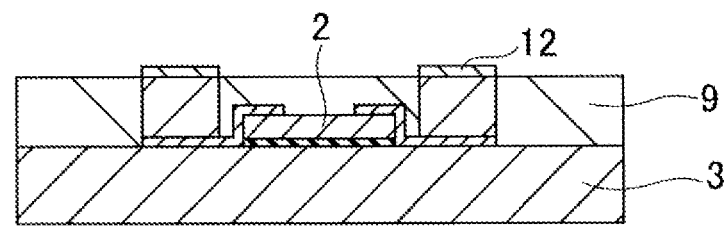
Figure 11F:
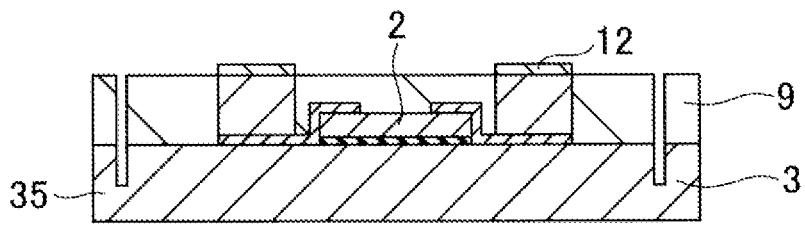
Figure 11G:
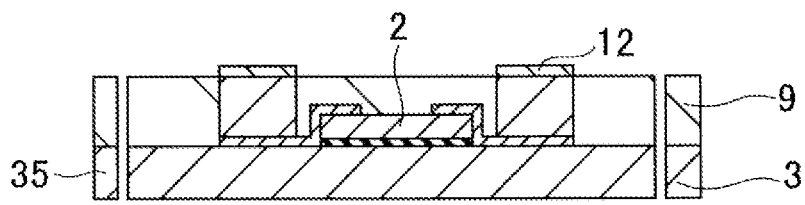

Next, as illustrated in FIG. 11C, an epoxy resin is molded over first electrical component 2, second electrical component 3, conductive layer 5 and pillar 10. As illustrated in FIG. 11D, the upper portion of the molding material 9 is ground in order to expose the top of pillar 10. As illustrated in FIG. 11E, terminal 12 for external connection is formed on the top of pillar 10 by plating. As illustrated in FIG. 11F, the wafer is cut halfway from the side of molding material 9. Specifically, molding material 9 is cut along the entire length in the thickness direction thereof, and second substrate 35 is cut halfway in the thickness thereof. As illustrated in FIG. 11G, second substrate 35 is ground from the opposite surface in order to thin second substrate 35 until no uncut portion remains in the thickness direction. Thus, stacks 1 are separated. It should be noted that the processes illustrated in FIGS. 11F and 11G may be omitted when stack 101 does not need to be thinned.

Figure 12:
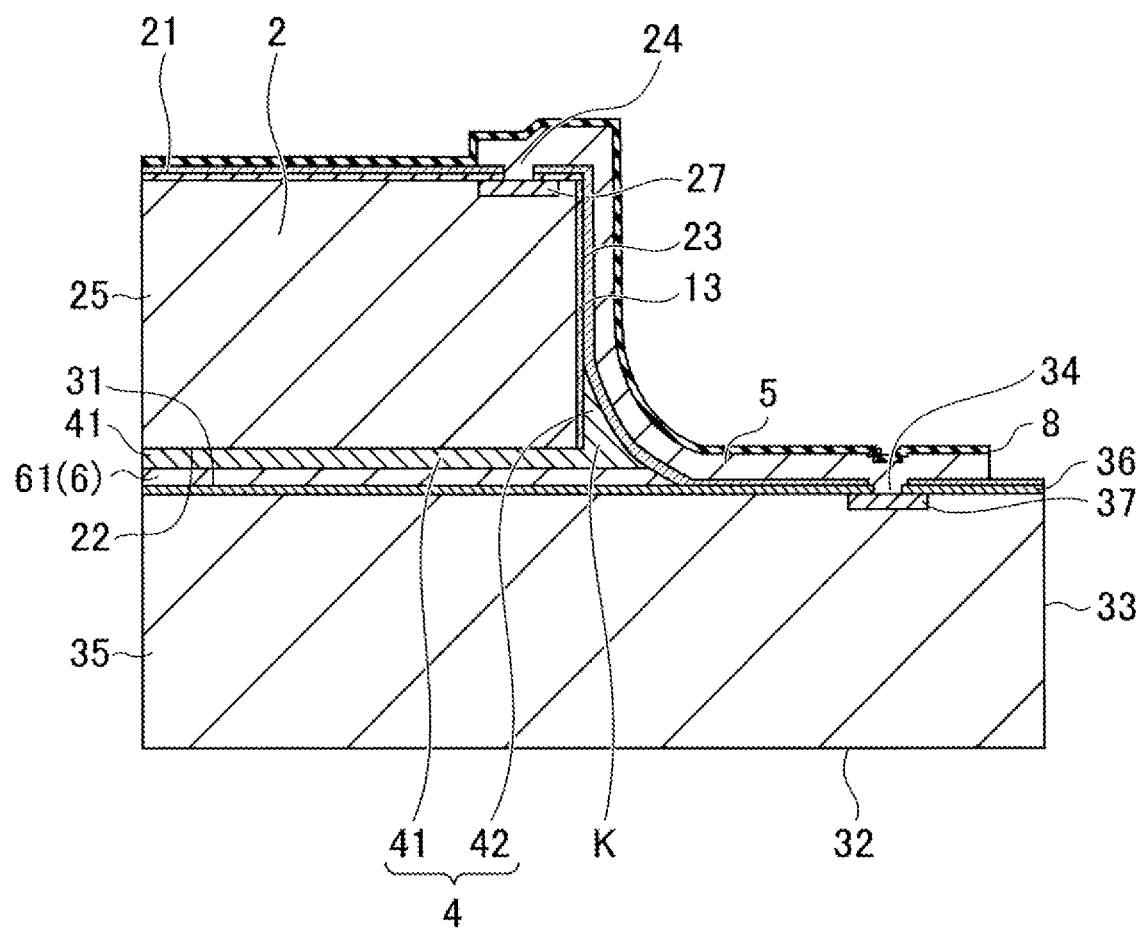
FIG. 12 is a cross-sectional view of a stack according to another modification.

Although the present invention has been described by the embodiments, various modifications can be made. For example, as illustrated in FIG. 12, second insulating layer 13 may be provided on first side surface 23 of first electrical member 2. Conductive layer 5 is insulated from first electrical component 2 with first insulating layer 7. However, conductive layer 5 is close to first electrical component 2, in particular, above first side surface 23 of first electrical component 2 (neat first surface 21), and therefore it may be difficult to secure insulation by simply providing a gap if a defect is generated in first insulating layer 7. Second insulating layer 13 enhances the reliability of the insulation. Second insulating layer 13 can be provided in the wafer process, and no significant disadvantages occur during this process.

Figure 13:
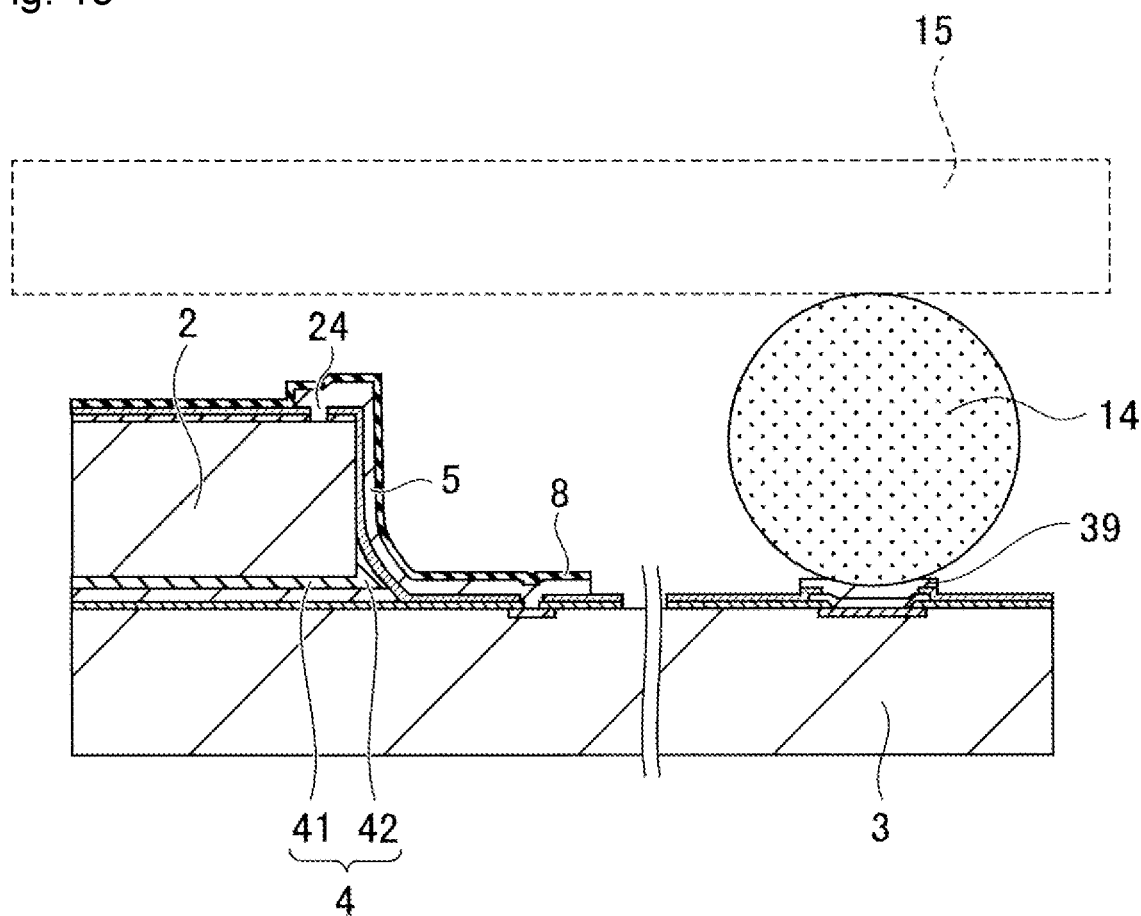
FIG. 13 is a cross-sectional view of a stack according to yet another modification.

As illustrated in FIG. 13, stack 1 can also be connected to another device 15, which is indicated by the dashed line, via solder ball 14 that is connected to external connecting pad 39.

In the present embodiment, first electrical component 2 has a rectangular parallelepiped shape, and first surface 21 and second surface 22 are flat and parallel to each other. However, first surface 21 and second surface 22 may be curved or uneven. First surface 21 and second surface 22 may not be parallel to each other.

Furthermore, in the present embodiment, conductive layer 5 extends from first electrical connection 24 of first electrical component 2 toward third surface 31 along the side of first side surface 23 of first electrical component 2, but conductive layer 5 does not need to be connected to first electrical connection 24. For example, conductive layer 5 may extend from an electrical connection of another electrical component, which is mounted on first electrical component 2, on the side of first side surface 23 of first electrical component 2. In other words, the conductive layer may follow any route as long as the conductive layer extends on the side of first side surface 23 of first electrical component 2, curves along second portion 42 of adhesive layer 4, and extends to third surface 31 of second electrical component 3.

In the present embodiment, first electrical component 2 is a magnetic sensor, and second electrical component 3 is an integrated circuit that is connected to the magnetic sensor. However, a configuration is also possible in which first electrical component 2 is an integrated circuit and second electrical component 3 is a magnetic sensor. That is, it is possible that either first electrical component 2 or second electrical component 3 is a magnetic sensor and the remaining component is an integrated circuit that is connected to the magnetic sensor.

In the present embodiment, first electrical component 2 is mounted on second electrical component 3. However, a third electrical component may be mounted on second electrical component 3. In this case, the third electrical component may be mounted on the surface of second electrical component 3 on which first electrical component 2 is mounted (third surface 31), but may be mounted on the surface opposite to third surface 31, that is, fourth surface 32.

Although certain preferred embodiments of the present invention have been shown and described in detail, it should be understood that various changes and modifications may be made without departing from the spirit or scope of the appended claims.

LIST OF REFERENCE NUMERALS 1 stack
2 first electrical component
3 second electrical component
4 adhesive layer
5 conductive layers
6 holding means
7 first insulating layer
9 molding material
11 third insulating layer
13 second insulating layer
21 first surface
22 second surface
23 first side surface
24 first electrical connection
31 third surface
33 second side surface
34 second electrical connection
41 first portion
42 second portion
K corner portion

What is claimed is:

1. A stack of electrical components, comprising:
 a first electrical component having a first surface, a second surface that is opposite to the first surface and a side surface that is located between the first surface and the second surface;
 a second electrical component having a third surface on which the first electrical component is mounted, the third surface facing the second surface and forming a corner portion between the third surface and the side surface;
 an adhesive layer that bonds the first electrical component to the second electrical component, wherein the adhesive layer has a first portion that is located between the second surface and the third surface and a second portion that is made of a same material as the first portion and that fills the corner portion; and
 a conductive layer that extends on a side of the side surface, curves along the second portion and extends to the third surface.

2. The stack of electrical components according to claim 1, wherein the conductive layer extends from the first surface to the third surface.

3. The stack of electrical components according to claim 2, wherein the first electrical component has a first electrical connection on the first surface,
the second electrical component has a second electrical connection on the third surface, and
the conductive layer extends along the second portion of the adhesive layer and connects the first electrical connection to the second electrical connection.

4. The stack of electrical components according to claim 1, further comprising a holding surface for the adhesive layer between the second electrical component and the adhesive layer, wherein wettability of the holding surface is larger than that of the third surface.

5. The stack of electrical components according to claim 4, wherein a circumference of the holding surface is formed outside a circumference of the first electrical component along an entire circumference thereof, as viewed in a direction perpendicular to the third surface.

6. The stack of electrical components according to claim 1, wherein the holding surface protrudes from the third surface toward the first electrical component.

7. The stack of electrical components according to claim 1, further comprising a recess that holds the adhesive layer, wherein the recess is recessed from the third surface in a direction away from the first electrical component.

8. The stack of electrical components according to claim 7, wherein a circumference of the recess is formed outside a circumference of the first electrical component along an entire circumference thereof, as viewed in a direction perpendicular to the third surface.

9. The stack of electrical components according to claim 1, further comprising a frame member that is provided on the third surface and that holds the adhesive layer.

10. The stack of electrical components according to claim 9, wherein a circumference of the frame member is formed outside a circumference of the first electrical component along an entire circumference thereof, as viewed in a direction perpendicular to the third surface.

11. The stack of electrical components according to claim 1, wherein a thickness of the second portion monotonically increases toward the third surface.

12. The stack of electrical components according to claim 1, wherein the second portion has a curved shape that is concave near the corner portion.

13. The stack of electrical components according to claim 1, further comprising a first insulating layer that is provided both between the conductive layer and the third surface and between the conductive layer and the side surface.

14. The stack of electrical components according to claim 1, further comprising a second insulating layer that is provided on the side surface.

15. The stack of electrical components according to claim 1, wherein the adhesive layer is made of silicone resin and further comprises:
an epoxy resin layer that covers the second portion of the adhesive layer and the conductive layer, and
a third insulating layer is provided between the second portion of the adhesive layer and the epoxy resin layer.

16. The stack of electrical components according to claim 1, wherein either the first electrical component or the second electrical component is a magnetic sensor, and the remaining is an integrated circuit that is connected to the magnetic sensor.

17. A stack of electrical components, comprising:
a first electrical component having a first surface, a second surface that is opposite to the first surface and a side surface that is located between the first surface and the second surface;
a second electrical component having a third surface on which the first electrical component is mounted, the third surface facing the second surface and forming a corner portion between the third surface and the side surface;
an adhesive layer that bonds the first electrical component to the second electrical component, wherein the adhesive layer has a first portion that is located between the second surface and the third surface and a curved second portion that is made of a same material as the first portion and that fills the corner portion; and
a conductive part that connects the first electrical component with the second electrical component.

18. A stack of electrical components, comprising:
a first electrical component having a first surface, a second surface that is opposite to the first surface and a side surface that is located between the first surface and the second surface;
a second electrical component having a third surface on which the first electrical component is mounted, the third surface facing the second surface and forming a corner portion between the third surface and the side surface;
an adhesive layer that bonds the first electrical component to the second electrical component, wherein the adhesive layer has a first portion that is located between the second surface and the third surface and a curved second portion that is made of a same material as the first portion and that is positioned at the corner portion; and
a conductive layer that extends on a side of the side surface, curves along the second portion and extends to the third surface.

19. A stack of electrical components, comprising:
a first electrical component having a first surface, a second surface that is opposite to the first surface and a side surface that is located between the first surface and the second surface;
a second electrical component having a third surface on which the first electrical component is mounted, the third surface facing the second surface and forming a corner portion between the third surface and the side surface;
a filling material that has a first portion that is located between the second surface and the third surface and a curved second portion that is made of a same material as the first portion and that fills the corner portion; and
a conductive layer that extends on a side of the side surface, curves along the second portion and extends to the third surface.

* * * * *